United States Patent
Johnson, Jr. et al.

(10) Patent No.: US 10,165,679 B2
(45) Date of Patent: Dec. 25, 2018

(54) SCALABLE, PRINTABLE, PATTERNED SHEET OF HIGH MOBILITY GRAPHENE ON FLEXIBLE SUBSTRATES

(71) Applicant: The Trustees of The University of Pennsylvania, Philadelphia, PA (US)

(72) Inventors: Alan T. Johnson, Jr., Philadelphia, PA (US); Rajatesh R. Gudibande, Philadelphia, PA (US); Zhengqing John Qi, Albany, NY (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 15/850,046

(22) Filed: Dec. 21, 2017

(65) Prior Publication Data

US 2018/0160530 A1 Jun. 7, 2018

Related U.S. Application Data

(63) Continuation of application No. 15/305,167, filed as application No. PCT/US2015/027193 on Apr. 23, 2015, now Pat. No. 9,930,777.

(Continued)

(51) Int. Cl.
*H05K 1/09* (2006.01)
*H05K 3/20* (2006.01)
(Continued)

(52) U.S. Cl.
CPC .......... *H05K 1/09* (2013.01); *H01L 29/1606* (2013.01); *H05K 1/0306* (2013.01); *H05K 3/06* (2013.01);
(Continued)

(58) Field of Classification Search
CPC .......... H05K 1/09; H05K 3/06; H05K 3/1216; H05K 3/125; H05K 3/1275;
(Continued)

(56) References Cited

U.S. PATENT DOCUMENTS

| | | | |
|---|---|---|---|
| 9,214,559 B2 | 12/2015 | Lee et al. | |
| 2013/0098540 A1* | 4/2013 | Lee | H01L 29/42384 |
| | | | 156/230 |
| 2014/0014030 A1 | 1/2014 | Tour et al. | |

FOREIGN PATENT DOCUMENTS

| | | |
|---|---|---|
| EP | 2690664 A1 | 1/2014 |
| WO | 2007/094757 A2 | 8/2007 |

(Continued)

OTHER PUBLICATIONS

Meitl, M et al., "Transfer printing by kinetic control of adhesion to an elastomeric stamp", Dec. 11, 2005, Nature Materials, vol. 5, Jan. 2006, [online], [retrieved on Jul. 9, 2015]. Retrieved from the Internet: <URL: http://rpgers.matse.illinois.edu/files/2006/nmat1532.pdf>; p. 34, figure 2c; p. 35, paragraph 3, figures 3b-3d.

(Continued)

*Primary Examiner* — Michael C Miggins
(74) *Attorney, Agent, or Firm* — Baker & Hostetler LLP (57) ABSTRACT

The present invention provides methods for fabricating graphene workpieces. The present invention also provides for products produced by the methods of the present invention and for apparatuses used to perform the methods of the present invention.

22 Claims, 7 Drawing Sheets

Related U.S. Application Data (60) Provisional application No. 61/983,014, filed on Apr. 23, 2014.

(51) Int. Cl.
    *H05K 1/03*     (2006.01)
    *H05K 3/06*     (2006.01)
    *H05K 3/12*     (2006.01)
    *H01L 29/16*     (2006.01)
    *H01G 11/32*     (2013.01)

(52) U.S. Cl.
    CPC ........... *H05K 3/125* (2013.01); *H05K 3/1216* (2013.01); *H05K 3/1275* (2013.01); *H05K 3/20* (2013.01); *H01G 11/32* (2013.01); *H05K 2201/0323* (2013.01); *H05K 2203/1338* (2013.01)

(58) Field of Classification Search
    CPC ... H05K 2201/0323; H05K 2201/1338; H05K 1/0306; H05K 3/20; H01L 29/1606; H01G 11/32
    See application file for complete search history.

(56) References Cited

FOREIGN PATENT DOCUMENTS

| | | |
|---|---|---|
| WO | 2009/129194 A2 | 10/2009 |
| WO | 2011/112589 A1 | 9/2011 |

OTHER PUBLICATIONS

Liang et al., "Graphene Transistors Fabricated via Transfer-Printing in Device Active-Areas on large Wafer", Nano Letters, Nov. 14, 2007, 7, 3840-3844.

Li, X et al., "Evolution of Graphene Growth on Ni and Cu by Carbon Isotope Labeling", Aug. 27, 2009, Nano Letters (2009) 9, 4268-4272, [online], [retrieved on Jul. 9, 2015]. Retrieved from the Internet: <URL: >; p. 4268, abstract, figure 2, paragraph 4; p. 4271, paragraph 5.

Kim et al., Large-scale pattern growth of graphene films for stretchable transparent electrodes, Nature, Feb. 5, 2009, vol. 457, 706-710.

Gao et al., "Repeated growth and bubbling transfer of graphene with millimeter-size single-crystal grains using platinum", Nature Communications, Feb. 2012, 3:699, 1-7.

Chen et al., "The selective transfer of patterned graphene", Scientific Reports, Nov. 14, 2013, 3, 3216, 6 pages.

\* cited by examiner

SCALABLE, PRINTABLE, PATTERNED SHEET OF HIGH MOBILITY GRAPHENE ON FLEXIBLE SUBSTRATES

CROSS-REFERENCE TO RELATED APPLICATIONS

This application is a continuation application of U.S. patent Ser. No. 15/305,167, filed Oct. 19, 2016, which is a National Stage Application of International Patent Application No. PCT/US2015/027193, filed Apr. 23, 2015, which claims benefit of U.S. Patent Application No. 61/983,014, filed Apr. 23, 2014, the disclosures of which are both incorporated herein by reference in their entirety.

GOVERNMENT RIGHTS

The invention was made with government support under Contract No. DMR08-32802 awarded by the Nano/Bio Interface Center NSF NSEC. The government has certain rights in the invention.

FIELD OF THE INVENTION

The disclosed invention is directed toward the fields of graphene workpieces and of manufacturing methods thereof.

BACKGROUND

The present application generally relates to methods and apparatus for transfer of films from one or more substrates to another, where the film to be transferred is patterned during the transfer step.

Since the first isolation of graphene in 2004, interest in the material has surged in the research community and more recently in industry as the first commercial ventures in graphene production and applications have emerged. Graphene is a single atom thick sheet of carbon atoms packed in a honeycomb lattice that has unique properties owing to its two-dimensional geometry and aromatic chemical structure. The unique band structure of this material shows a linear dispersion relation at low energies, allowing the holes and electrons to have zero effective mass and behave like relativistic particles. This leads to impressive electrical properties, such as measured mobilities of 200,000 $cm^2$/V-s and ballistic transport on the micrometer scale at room temperature. Additionally, the superior tensile strength of the material allows for high electrical performance even under bending and deformation. Due to these fantastic properties, there has been great interest for applications in high performance nanoelectronics, flexible electronics, and environmental/biological monitoring applications.

Graphene can be grown in high quality sheets on catalytic metal by chemical vapor deposition at industrial scale, presenting an opportunity for graphene commercialization that is being pursued by multiple companies. In conventional approaches, graphene is coated with a thin polymer layer (e.g., polymethylmethacrylate—PMMA) to provide mechanical stability and then removed from a copper growth substrate for transfer onto another substrate as a full sheet that may then be patterned into electrical devices, etc. There are several disadvantages of this—e.g., the graphene can be wrinkled during the transfer process since the PMMA layer is very thin and flexible; the graphene can be contaminated with PMMA residue after cleaning; and the subsequent patterning process can expose the graphene to chemical contamination. Each of these causes the physical properties (including the carrier mobility) of the graphene to degrade. Processes are needed for transferring graphene from growth substrates to other surfaces while protecting the beneficial properties of the material so that it may be used in commercial devices.

Thus, there is a need for processes that enable transfer of graphene from growth substrates to other surfaces. There are sets of materials "beyond graphene" (e.g., few-layer graphene, boron nitride, molybdenum disulfide, other transition metal dichalcogenides, and the like) with similar needs for advanced methods of film transfer. The instant disclosure is directed to these and other important needs.

SUMMARY

The present disclosure provides methods for forming a workpiece, the methods comprising growing pristine monolayer continuous graphene on a catalytic film to form a graphene/catalytic film bilayer, attaching a first layer of material on top of the graphene surface, and releasing the graphene from the catalytic film, such that the first layer of material is sufficiently rigid that it resists folding or tearing through the rest of the process. In this way the process ensures that the graphene film preserves its very high electronic and structural quality. In addition, there are sets of materials "beyond graphene" (e.g., few-layer graphene, boron nitride, molybdenum disulfide, other transition metal dichalcogenides, and the like) with similar needs for advanced methods of film transfer. The disclosure is directed to these and other important needs.

The present disclosure also provides workpieces, comprising a substrate, a patterned layer of graphene disposed on the substrate, and a patterned layer of material disposed on the graphene. The present disclosure also provides electronic devices comprising the workpieces.

The present disclosure also provides workpieces, comprising a substrate, a layer of pristine monolayer continuous graphene disposed on the substrate, and a patterned layer of material disposed on the graphene.

The present disclosure also provides workpieces, comprising a patterned layer of graphene and a patterned layer of a first material disposed on the graphene.

The general description and the following detailed description are exemplary and explanatory only and are not restrictive of the invention, as defined in the appended claims. Other aspects of the present disclosure will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

In one embodiment, the disclosure provides scalable printing-based method for patterning monolayer graphene into arbitrary geometries on flexible polymer substrates while maintaining the high intrinsic mobility of the material (10,000 $cm^2$/V-s). In one embodiment of the invention, a graphene-on-polymer material can be made via a process comprising laser printing to pattern printer toner onto graphene grown via chemical vapor deposition on a copper foil substrate to achieve wrinkle-free release from the growth substrate. The graphene layer of the resulting graphene-on-polymer structure retains the high mobility and environmental sensitivity characteristic of high-quality graphene, making the structure suitable for use in a number of applications in flexible/foldable electronics, wearable vapor sensors for environmental monitoring, printable biosensors for facile medical diagnosis, as well as inexpensive next-generation energy materials (supercapacitors, transparent electrodes).

In one embodiment, the present invention provides methods of forming a workpiece. These methods may include growing graphene (e.g., pristine monolayer continuous graphene) on a catalytic film to form a graphene/catalytic film bilayer. The methods may also include disposing a first layer of material on top of the graphene surface and releasing the graphene from the catalytic film. In some embodiments, growing graphene on a catalytic film is performed by chemical vapor deposition (CVD) at either atmospheric or low pressure. The catalytic film can comprise Cu or Pt foil in some embodiments; catalytic materials that can support graphene growth will be known to those of ordinary skill in the art. In some embodiments, the catalytic foil can comprise a roll and the graphene growing can occur in a "roll-to-roll" system, which may incorporate a CVD process.

The first layer of material on top of the graphene can be disposed as a patterned or unpatterned layer; in some embodiments it is formed with a printing process that allows for patterning, e.g., printing on the surface of the graphene surface with a laser printer, by printing on the surface of the graphene surface with an inkjet printer with a polymer ink, by selective sintering of material (selective heat sintering, selective laser sintering, or both) in a 3D printer, or by selectively depositing a liquid binding material in a powder-bed layer of a 3D printer. Other printing methods may be used as will be known to those of ordinary skill in the art. The printing process should be engineered so as to avoid damaging or destroying the graphene, which may occur, for example, through the use of a sintering process that exposes the graphene to excessively high temperatures in the presence of oxygen. Preferably (though not necessarily), the first layer of material is disposed and patterned if so desired without the use of a photoresist material as these materials can damage the electronic characteristics of the graphene. The first layer of material must be made solid and must bond to the graphene in order to provide structural support to the released graphene. Any printing process which is capable of disposing a first layer of any material capable of solidifying and bonding to the graphene is suitable. In some embodiments, a second layer of material can be disposed on top of the first layer of material. In preferred methods, the second layer of material is a substantially unpatterned layer that does not substantially contact the graphene. The releasing of the graphene from the catalytic film can be performed by a bubbling transfer process, as described by Gao et al., "Repeated growth and bubbling transfer of graphene with millimeter-size single-crystal grains using platinum," Nature Communications 3(2012):699, incorporated herein by reference in its entirety for all purposes. In methods utilizing a second layer of material that does not substantially contact the graphene, the bubbling transfer process results in the removal of all graphene which is not in contact with the first layer of material. In some embodiments the method further comprises attaching the released graphene to a substrate, which can comprise one or more of the following: glass, silicon, silicon dioxide, aluminum oxide, sapphire, germanium, gallium arsenide, indium phosphide, an alloy of silicon and germanium, PET, polyimide, other plastics, or silk. In one preferred embodiment, the substrate comprises Si/$SiO_2$ and the graphene is attached to the $SiO_2$ surface of the substrate.

The present disclosure also provides workpieces. These workpieces may include a substrate, a patterned layer of graphene disposed on the substrate, and a patterned layer of a first material disposed on the graphene. In some embodiments, a workpiece further comprises an unpatterned layer of a second material disposed on the patterned layer of a first material, wherein the unpatterned layer of material does not substantially contact the layer of graphene or the substrate. The substrate may comprise one or more of the following: glass, silicon, silicon dioxide, aluminum oxide, sapphire, germanium, gallium arsenide, indium phosphide, an alloy of silicon and germanium, and the like. The workpieces preferably comprise graphene with a carrier mobility of greater than about 5,500 $cm^2/V$-s. In preferred embodiments, the patterned layer of a first material disposed on the graphene comprises a thickness of less than about 20 micrometers, less than about 10 micrometers, or even less than about 5 micrometers. Also further preferred are embodiments wherein the patterned layer of a first material disposed on the graphene, the unpatterned layer of a second material disposed on the patterned layer of material, or each individually comprises a thickness of less than about 10 micrometers. In some embodiments the workpieces can comprise a patterned layer of a first material disposed on the graphene comprises features having a characteristic dimension of less than about 10 micrometers.

The present invention also provides for electronic devices comprising the workpieces described herein. Such an electronic device can may include a workpiece integrated on semiconductor substrates along with electrode contacts.

The present invention also provides alternative workpieces. Such workpieces suitably include a substrate, a layer of graphene (e.g., pristine monolayer continuous graphene) disposed on the substrate, and a patterned layer of a first material disposed on the graphene. The substrate can comprise a catalytic film that can support graphene growth, which comprises Cu or Pt foil in some embodiments; catalytic materials that can support graphene growth will be known to those of ordinary skill in the art. In preferred embodiments, the first material can comprise a polymer or plastic material. In further preferred embodiments, the first material can comprise a flexible polymer. In preferred embodiments, the patterned layer of a first material disposed on the graphene comprises a thickness of less than about 20 micrometers, less than about 10 micrometers, or even less than about 5 micrometers.

In other embodiments, the present invention provides workpieces, comprising a patterned layer of graphene, and a patterned layer of a first material disposed on the graphene. In some embodiments, the workpieces further comprise an unpatterned layer of a second material disposed on the patterned layer of a first material, wherein the unpatterned layer of a second material does not substantially contact the layer of graphene. Preferably, the first material, the second material, or both comprises a flexible polymer. Suitable flexible polymers include commercial printer toners, polymer inks, or materials which are flexible following disposition via 3-D printing. The patterned layer of a first material disposed on the graphene, the unpatterned layer of a second material disposed on the patterned layer of material, or each individually may comprise a thickness of less than about 20 micrometers, less than about 10 micrometers, or even less than about 5 micrometers.

The disclosure is illustrated by the following non-limiting examples.

Example 1

In one aspect, the present disclosure provides a methods that result in pristine graphene layers on a thin, flexible toner or polymer substrate in any desired pattern that can be defined by a printing process.

First, pristine monolayer continuous graphene is grown on a copper film by chemical vapor deposition (CVD) at either atmospheric or low pressure to create a copper film/graphene bi-layer. Next, the copper film/graphene bi-layer is attached to a suitable support and inserted into a printing apparatus for the attachment of patterned material to the graphene surface. In one embodiment, the copper film/graphene bi-layer is attached to ordinary printer paper with tape and inserted into a laser printer. In other embodiments, the copper film/graphene bi-layer is attached to a suitable support for insertion into a 3D printer. In yet other embodiments, graphene can be formed on a roll of catalytic foil, such as in a "roll-to-roll" process, which can then be fed through a printing apparatus. Patterns can be printed successfully without damaging the graphene using a variety of printing apparatuses and techniques. These techniques result in a pattern of a solid polymer layer on the graphene surface. In one embodiment, a conventional laser printer can be used. Other printing methods include color laser printers and inkjet printing using polymer or polymer-composite inks. In further embodiments, a patterned layer of material may be formed on the surface of the graphene using a 3D printer, which printer may utilize selective heat sintering or selective laser sintering, or alternatively may utilize selective deposition of a liquid binding material in a powder-bed layer. The printing process should be engineered so as to avoid damaging or destroying the graphene, which may occur, for example, through the use of a sintering process that exposes the graphene to excessively high temperatures. The printed layer's thickness is determined by the printing apparatus used, which can be about around 10 micrometers in the case of laser printer toner, although other thicknesses in the range of from about 500 nm to about 100 micrometers are also suitable; the thickness may be varied as desired for particular applications. This can be adjusted through engineering of the printing process. The line width of the patterning is determined by the resolution of the printer, which can be as small as 1 micrometer, 5 micrometers, or even 10 micrometers for the advanced laser printers, for example. No subsequent processing is needed. There is no need for the use of photoresist, as the subsequent "bubble method" release step leads to a patterned graphene layer attached to the thin layer of printed material.

Figure 1:
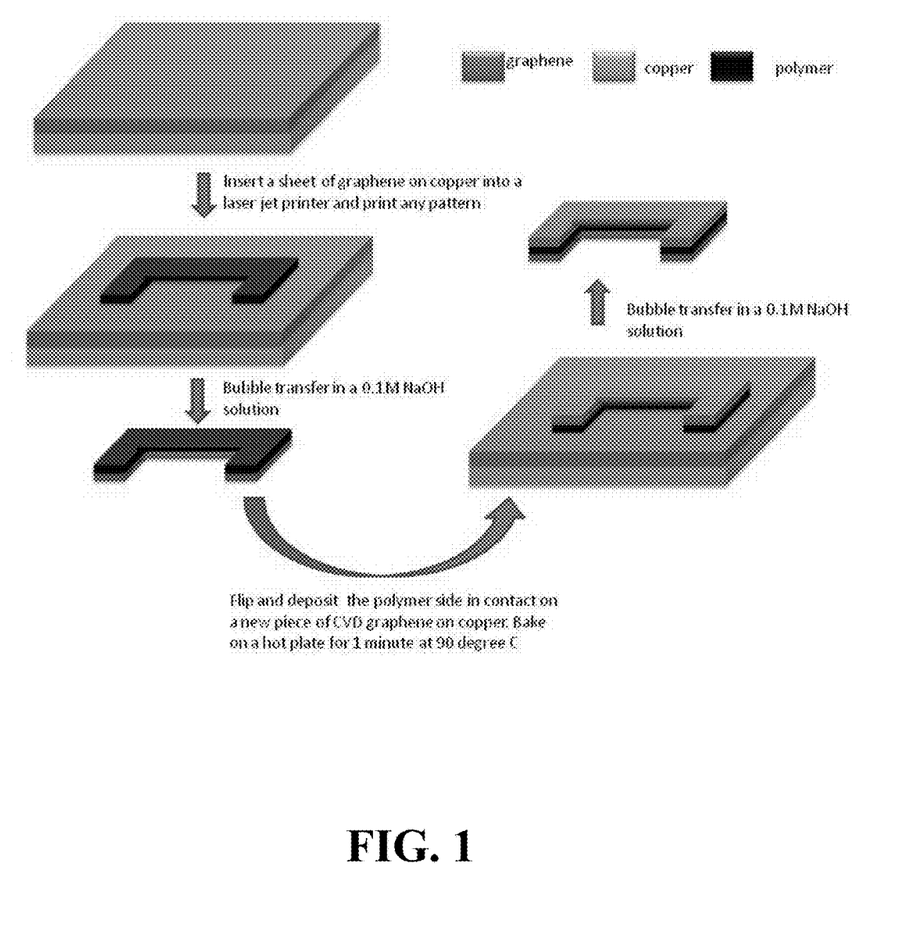
FIG. 1 illustrates an embodiment of the present invention directed to a workpiece. The workpiece in the upper left has a graphene top layer and a copper bottom layer. The middle left workpiece is the same as the top left workpiece except it has a polymer layer on top.

A process for making a workpiece using a conventional laser printer is shown schematically in FIG. 1.

Next, graphene is transferred off of the copper film using suitable techniques. This can be achieved without applying any additional layers that provide mechanical backing for the graphene. In some embodiments, the "bubble transfer" method described by Gao et al., "Repeated growth and bubbling transfer of graphene with millimeter-size single-crystal grains using platinum," Nature Communications 3(2012):699, incorporated herein by reference in its entirety for all purposes. Other methods that do not apply additional layers that provide mechanical backing for the graphene are also suitable, e.g., dissolving the catalytic foil. The graphene that has the patterned layer of printed material disposed on it then transfers off the copper foil intact while unsupported graphene disintegrates during the process. Thus, the material that survives the transfer process is the patterned graphene-material complex that was created during the printing process.

Figure 2:
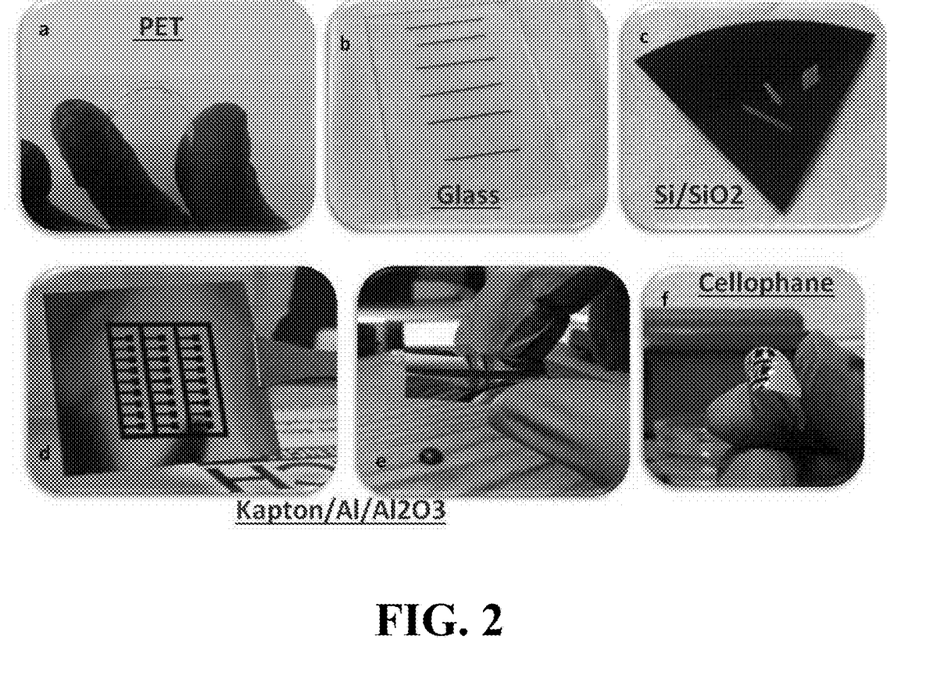
FIG. 2 illustrates an alternative embodiment of the present invention directed to workpieces on various solid and flexible substrates.
Figure 3:
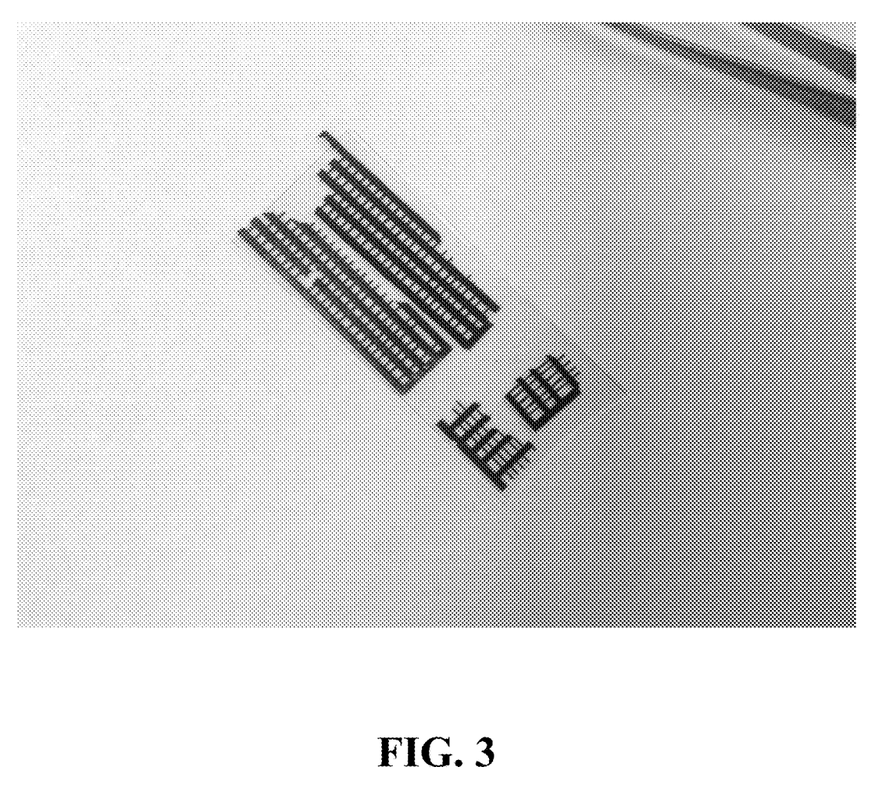
FIG. 3 illustrates exemplary embodiments of the present invention directed to workpieces.
Figure 4:
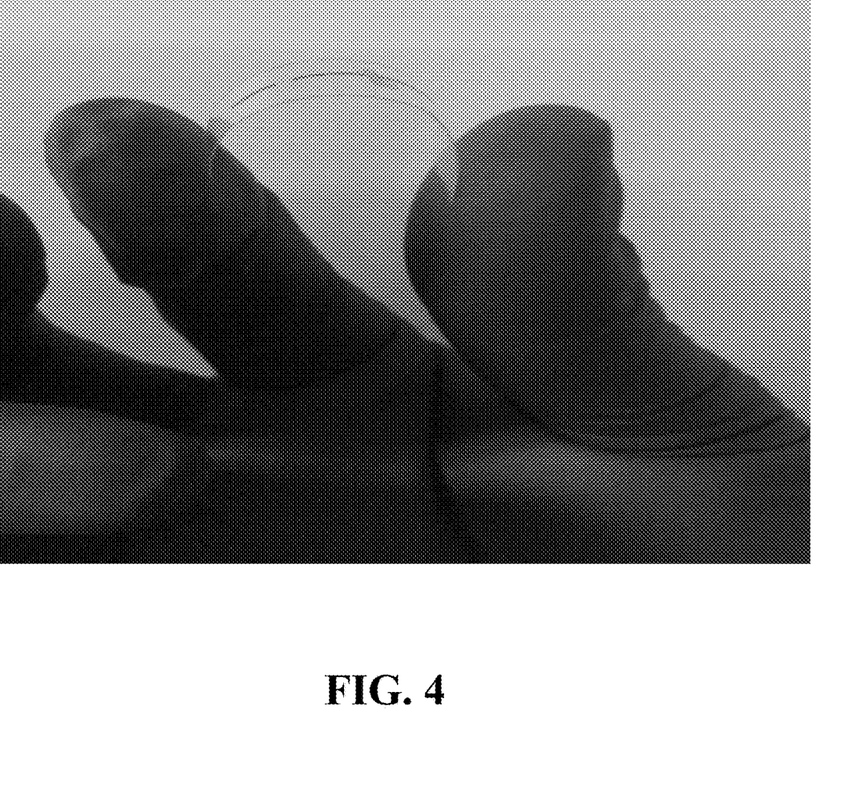
FIG. 4 illustrates an exemplary embodiment of the present invention directed to workpieces.

The graphene-on-material structure can be removed from the transfer bath using tweezers, or a PET sheet, and cleaned with standard processes. The printed material acts as a rigid backbone and provides mechanical support to the underlying graphene layer. Workpieces fabricated using the method described herein, with a conventional laser printer, and then transferred to a set of solid and flexible substrates, are shown in FIG. 2. Graphene was synthesized on copper catalytic foil to form a copper film/graphene bi-layer. The bi-layer was attached with transparent tape to a sheet of standard 8.5"×11" paper, with the copper layer facing the paper and the graphene layer exposed. The paper, with bi-layer attached, was then inserted into a conventional laser printer and a pattern was printed with commercial black laser printer toner or color laser printer toner. The workpiece can be curled around an object, such as an object with a radius 0.5 mm as shown in FIG. 2. Following release from curling, there were no visible signs of damage, and electrical properties of the graphene were measured before and after curling, indicating that the curling process did not degrade the electrical properties. Multiple workpieces fabricated using the method described herein, with a conventional laser printer, are shown in FIG. 3, which includes patterned graphene-on-polymer workpieces placed onto a glass slide for storage and later use. Additional workpieces have been fabricated using the method described herein with a color laser printer using various colored printer toners, which yielded similar results.

Example 2

In some embodiments, a 3D printer is used as in Example 1, with the further step of attaching a second layer of material on top of the patterned layer of material. As in Example 1, pristine monolayer continuous graphene is grown on a catalytic film by chemical vapor deposition (CVD) at either atmospheric or low pressure to create a catalytic film/graphene bi-layer. Next, the catalytic film/graphene bi-layer is attached to a suitable support and inserted into a 3D printing apparatus for the attachment of patterned material to the graphene surface. In the 3D printer, a patterned layer is disposed on the graphene surface of the catalytic film/graphene bi-layer.

After the formation of the patterned layer of material, a second, unpatterned layer can be formed on top of the patterned layer of material. This unpatterned layer may lie across the top of the patterned layer of material and unsintered or unbound 3D-printer build material that is disposed within the pattern. As a result, the unpatterned layer can be disposed on the first layer of patterned material without contacting the graphene. If the "bubble transfer" removal method is used, unsintered or otherwise unbound build material will be removed along with the disintegrating graphene that has no first layer disposed on it, leaving the patterned graphene matching the first patterned layer of material. In this fashion, the remaining graphene pattern is the same as one that would result from the process in Example 1, which did not utilize a second unpatterned layer of material. The second, unpatterned layer is useful for, inter alia, providing more structural support to the workpiece and allowing for the use of commercial water handling systems, such as vacuum, suction, or Bernoulli grippers.

Example 3

Graphene-on-polymer samples fabricated as described in Example 1, with a conventional laser printer used to create the patterned layer of polymer on the graphene layer, were evaluated for electrical performance. Samples comprised of a pristine monolayer graphene on a polymer toner backing.

The samples were curled 360 degrees with a radius of curvature of less than 1 mm as shown in FIG. 2 without affecting electrical performance, including carrier mobility.

Figure 5A:
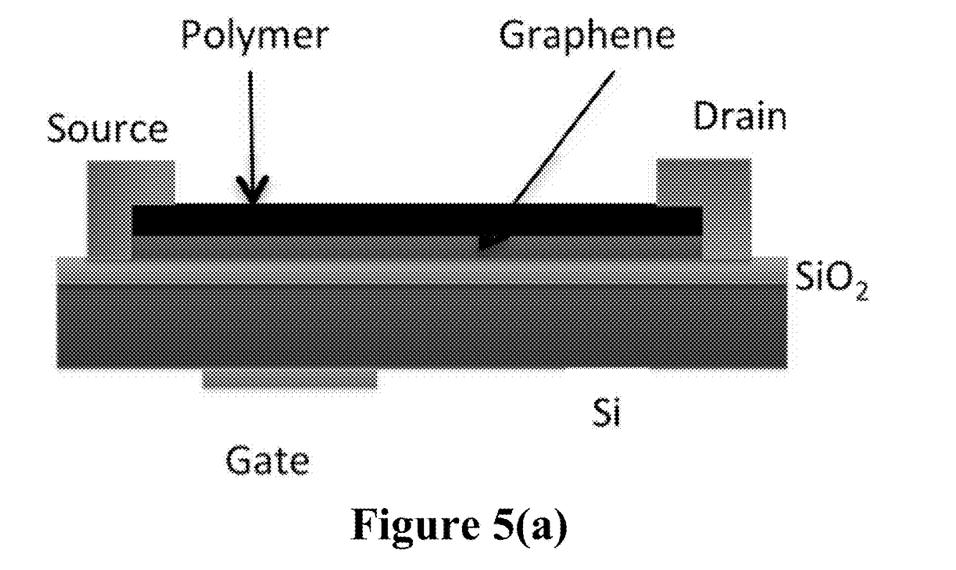
FIG. 5(a) illustrates an exemplary embodiment of the present invention directed to an electronic device comprising a workpiece.
Figure 5B:
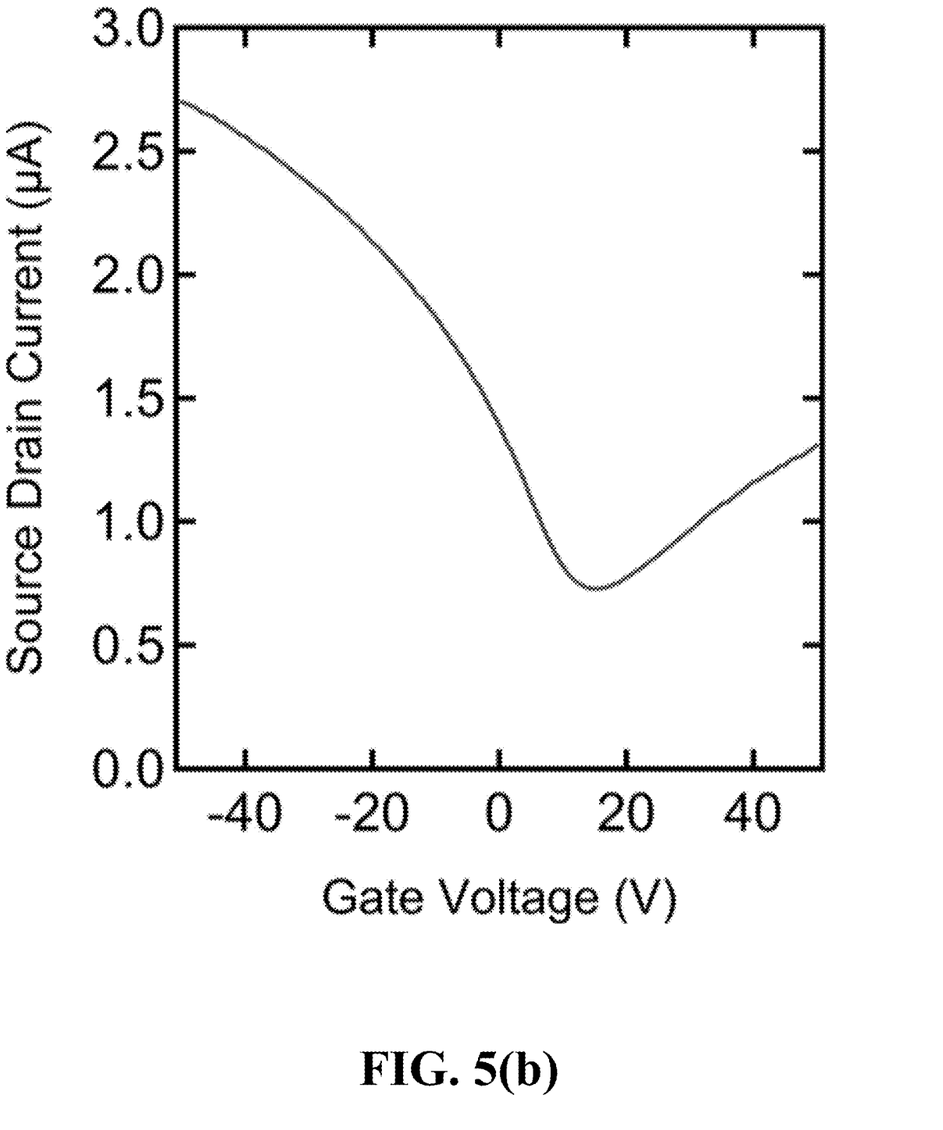
FIG. 5(b) provides electronic test data of an embodiment of the present invention directed to an electronic device comprising a workpiece.
Figure 6:
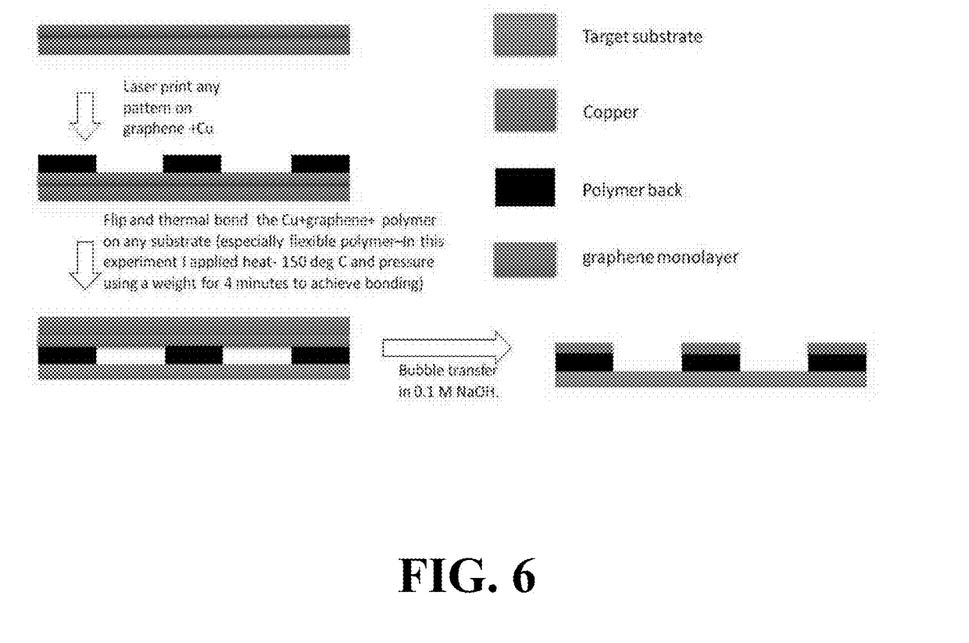
FIG. 6 provides a process whereby an embodiment is directed to an electronic device comprising a workpiece that is applied to a target substrate. In this figure, the workpiece in the upper left has a top layer of graphene monolayer and a bottom layer of copper. The middle workpiece on the left has a top layer of polymer a middle layer of graphene monolayer and a bottom layer of copper. The bottom left workpiece has a top layer of copper, a second layer of graphene monolayer, a third layer of polymer and a bottom layer that is the target substrate. The workpiece on the right has the target substrate on the bottom, polymer as the middle layer and graphene monolayer as the top layer.

Sample measurements were conducted using the sample geometry shown in FIG. 5($a$), in order to measure the current-gate voltage characteristic (I-Vg) of the graphene layer in a Graphene-on-polymer sample. The measurements are consistent with mobilities exceeding 5,000 $cm^2$/V-s, similar to what is intrinsic to CVD-grown graphene. FIG. 5($b$) shows a typical I-Vg of a sample after it has been curled around an object with a radius of 0.5 mm. Using a standard model, the inferred mobility is about 5,500 cm2/V-s. This value is substantially equivalent to that found for an identical sample that was not curled, implying that the graphene properties are unaltered by the curling process.

Terms

The terminology used herein is for the purpose of describing particular aspects only and is not intended to be limiting. For example, the term "comprising" can include the embodiments "consisting of" and "consisting essentially of." Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

When ranges are used herein for physical properties or chemical properties, all combinations, and subcombinations of ranges for specific embodiments therein are intended to be included.

The disclosures of each patent, patent application, and publication cited or described in this document are hereby incorporated herein by reference, in its entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed:

1. A method of forming a patterned structure, the method comprising:
   forming a graphene layer on a substrate;
   forming a patterned layer coupled to the graphene layer; and
   separating the graphene layer from the substrate according to a pattern of the patterned layer.

2. The method of claim 1, wherein said graphene layer comprises a graphene monolayer or continuous layers of graphene.

3. The method of claim 1, wherein forming the graphene layer on the substrate comprises depositing the graphene layer using chemical vapor deposition.

4. The method of claim 1, wherein forming the patterned layer comprises inkjet printing, laser printing, 3D printing, screen printing, flexography, gravure, offset lithography, nanoimprint lithography, or any combination thereof.

5. The method of claim 1, wherein the patterned layer is formed on the graphene layer.

6. The method of claim 1, wherein separating the graphene layer from the substrate comprises etching of the substrate, a bubbling transfer process, a mechanical separation process, or a combination thereof.

7. The method of claim 1, further comprising: forming a layer of material on the patterned layer prior to separating the graphene layer from the substrate.

8. The method of claim 1, wherein separating the graphene layer from the substrate comprises releasing portions of the graphene layer according to the pattern of the patterned layer.

9. The method of claim 1, wherein the graphene layer is supported by the patterned layer after the graphene layer is separated from the substrate.

10. The method of claim 1, wherein separating the graphene layer from the substrate comprises decoupling the substrate from the graphene layer.

11. The method of claim 1, wherein forming the patterned layer comprises selective sintering of a material.

12. The method of claim 1, wherein forming the patterned layer comprises selectively depositing a liquid binding material in a powder-bed layer.

13. The method of claim 1, wherein the substrate comprises a catalytic film.

14. The method of claim 13, wherein the catalytic film comprises Cu, Ni or Pt foil.

15. The method of claim 1, further comprising: attaching the separated graphene layer onto a base substrate.

16. The method of claim 15, wherein the separated graphene layer is attached with the patterned layer onto the base substrate.

17. The method of claim 15, wherein the base substrate comprises a layer of patterned and unpatterned material.

18. A patterned structure comprising:
a patterned layer; and
a graphene layer coupled to the patterned layer, wherein the graphene layer is configured to be separated from a substrate according to a pattern of the patterned layer to thereby pattern the graphene layer.

19. The patterned structure of claim 18, wherein the patterned layer provides support for the graphene layer that is separated from the substrate.

20. The patterned structure of claim 18, wherein the separated graphene layer has the same pattern as the patterned layer.

21. The patterned structure of claim 18, wherein the patterned structure is a free-standing structure that is separated from the substrate.

22. The patterned structure of claim 18, wherein the patterned structure is configured to be coupled to a base substrate.

* * * * *

UNITED STATES PATENT AND TRADEMARK OFFICE
CERTIFICATE OF CORRECTION

PATENT NO.         : 10,165,679 B2
APPLICATION NO.    : 15/850046
DATED              : December 25, 2018
INVENTOR(S)        : Johnson, Jr. et al.

It is certified that error appears in the above-identified patent and that said Letters Patent is hereby corrected as shown below:

In the Specification

Column 8, Line 22: Replace ""consisting essentially of"", with -- "consisting essentially of." --.

Signed and Sealed this
Twentieth Day of August, 2019

Andrei Iancu
*Director of the United States Patent and Trademark Office*